US011626378B2

(12) United States Patent
Chen

(10) Patent No.: US 11,626,378 B2
(45) Date of Patent: Apr. 11, 2023

(54) INTERCONNECT STRUCTURES, PACKAGED SEMICONDUCTOR DEVICES, AND METHODS OF PACKAGING SEMICONDUCTOR DEVICES

(71) Applicant: Taiwan Semiconductor Manufacturing Co., Ltd., Hsinchu (TW)

(72) Inventor: Hsien-Wei Chen, Hsinchu (TW)

(73) Assignee: TAIWAN SEMICONDUCTOR MANUFACTURING COMPANY LTD., Hsin-Chu (TW)

( * ) Notice: Subject to any disclaimer, the term of this patent is extended or adjusted under 35 U.S.C. 154(b) by 0 days.

(21) Appl. No.: 17/339,768

(22) Filed: Jun. 4, 2021

(65) Prior Publication Data

US 2021/0296274 A1 Sep. 23, 2021

Related U.S. Application Data

(62) Division of application No. 16/577,645, filed on Sep. 20, 2019, now Pat. No. 11,031,363, which is a (Continued)

(51) Int. Cl.

*H01L 23/00* (2006.01)
*H01L 25/10* (2006.01)

(Continued)

(52) U.S. Cl.

CPC .............. *H01L 24/14* (2013.01); *G06F 30/39* (2020.01); *H01L 23/3128* (2013.01); *H01L 24/03* (2013.01); *H01L 24/05* (2013.01); *H01L 24/11* (2013.01); *H01L 24/19* (2013.01); *H01L 25/105* (2013.01); *H01L 25/0657* (2013.01); *H01L 2224/04105* (2013.01);

(Continued)

(58) Field of Classification Search

CPC ......... H01L 24/04–06; H01L 24/12–14; H01L 21/565; H01L 2224/05011; H01L 2224/05017; H01L 2224/1412

See application file for complete search history.

(56) References Cited

U.S. PATENT DOCUMENTS 6,501,165 B1 12/2002 Farnworth et al.
6,940,176 B2 9/2005 Chen (Continued)

*Primary Examiner* — Tuan A Hoang

(74) *Attorney, Agent, or Firm* — Slater Matsil, LLP

(57) ABSTRACT

Interconnect structures, packaged semiconductor devices, and methods of packaging semiconductor devices are disclosed. In some embodiments, an interconnect structure includes dielectric layers, a conductive layer disposed in the dielectric layers, and a via layer disposed in the dielectric layers proximate the conductive layer. An underball metallization (UBM) layer is disposed in the dielectric layers proximate the via layer. A first connector coupling region is disposed in the via layer and the UBM layer. A via layer portion of the first connector coupling region is coupled to a first contact pad in the conductive layer. A second connector coupling region is disposed in the UBM layer. The second connector coupling region is coupled to a conductive segment in the UBM layer and the via layer. The second connector coupling region is coupled to a second contact pad in the conductive layer by the conductive segment.

20 Claims, 6 Drawing Sheets

Related U.S. Application Data division of application No. 14/632,858, filed on Feb. 26, 2015, now Pat. No. 10,497,660.

(51) Int. Cl.
*H01L 23/31* (2006.01)
*G06F 30/39* (2020.01)
*H01L 25/065* (2023.01)

(52) U.S. Cl.
CPC ............... *H01L 2224/05025* (2013.01); *H01L 2224/12105* (2013.01); *H01L 2224/1412* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/00014* (2013.01); *H01L 2924/1011* (2013.01); *H01L 2924/14* (2013.01); *H01L 2924/1436* (2013.01); *H01L 2924/15311* (2013.01); *H01L 2924/181* (2013.01)

(56) References Cited

U.S. PATENT DOCUMENTS 6,998,718 B2 2/2006 Chang et al.
7,364,998 B2 4/2008 Chiu et al.
7,439,170 B1 10/2008 Daubenspeck et al.
7,564,115 B2 7/2009 Chen et al.
7,633,165 B2 12/2009 Hsu et al.
7,825,024 B2 11/2010 Lin et al.
7,838,337 B2 11/2010 Marimuthu et al.
7,973,413 B2 7/2011 Kuo et al.
8,058,726 B1 11/2011 Jin et al.
8,105,875 B1 1/2012 Hu et al.
8,133,762 B2 * 3/2012 Pagaila ............... H01L 23/5283 438/117
8,158,456 B2 4/2012 Chen et al.
8,183,578 B2 5/2012 Wang
8,183,579 B2 5/2012 Wang
8,198,133 B2 6/2012 Daubenspeck et al.
8,227,902 B2 7/2012 Kuo
8,278,152 B2 10/2012 Liu et al.
8,361,842 B2 1/2013 Yu et al.
8,362,612 B1 1/2013 Paek et al.
8,410,595 B2 4/2013 Kroehnert et al.
8,426,961 B2 4/2013 Shih et al.
8,669,174 B2 3/2014 Wu et al.
8,680,647 B2 3/2014 Yu et al.
8,703,542 B2 4/2014 Lin et al.
8,759,964 B2 6/2014 Pu et al.
8,778,738 B1 7/2014 Lin et al.
8,785,299 B2 7/2014 Mao et al.
8,802,504 B1 8/2014 Hou et al.
8,803,292 B2 8/2014 Chen et al.
8,803,306 B1 8/2014 Yu et al.
8,803,316 B2 8/2014 Lin et al.
8,809,996 B2 8/2014 Chen et al.
8,829,676 B2 9/2014 Yu et al.
8,877,554 B2 11/2014 Tsai et al.
2004/0121606 A1 6/2004 Raskin et al.
2005/0176233 A1 8/2005 Joshi et al.
2006/0038291 A1 2/2006 Chung et al.
2011/0291288 A1 12/2011 Wu et al.
2013/0026468 A1 1/2013 Yoshimuta et al.
2013/0062760 A1 3/2013 Hung et al.
2013/0062761 A1 * 3/2013 Lin ......................... H01L 24/92 257/737
2013/0087925 A1 4/2013 Tsai et al.
2013/0113097 A1 * 5/2013 Yu ........................... H01L 24/14 438/666
2013/0147034 A1 * 6/2013 Chen ....................... H01L 24/13 257/737
2013/0168848 A1 7/2013 Lin et al.
2013/0241052 A1 9/2013 Chang et al.
2013/0307140 A1 11/2013 Huang et al.
2014/0001645 A1 1/2014 Lin et al.
2014/0203429 A1 7/2014 Yu et al.
2014/0225222 A1 8/2014 Yu et al.
2014/0225258 A1 8/2014 Chiu et al.
2014/0252572 A1 9/2014 Hou et al.
2014/0252646 A1 9/2014 Hung et al.
2014/0264930 A1 9/2014 Yu et al.

* cited by examiner

INTERCONNECT STRUCTURES, PACKAGED SEMICONDUCTOR DEVICES, AND METHODS OF PACKAGING SEMICONDUCTOR DEVICES

PRIORITY CLAIM AND CROSS-REFERENCE

This application is a divisional of U.S. patent application Ser. No. 16/577,645, filed on Sep. 20, 2019, entitled "Interconnect Structures, Packaged Semiconductor Devices, and Methods of Packaging Semiconductor Devices," now U.S. Pat. No. 11,031,363 issued Jun. 8, 2021, which application is a divisional of U.S. patent application Ser. No. 14/632,858, filed on Feb. 26, 2015, entitled "Interconnect Structures, Packaged Semiconductor Devices, and Methods of Packaging Semiconductor Devices," now U.S. Pat. No. 10,497,660 issued Dec. 3, 2019, which applications are hereby incorporated by reference herein as if reproduced in their entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DIC wherein dies are packaged and are then packaged together with another packaged die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
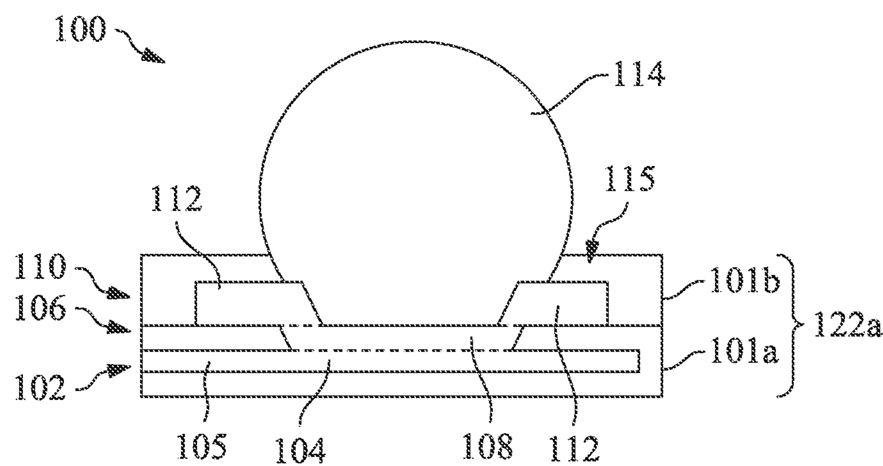
FIG. 1A is a cross-sectional view that illustrates a first connector coupling region of an interconnect structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Interconnect structures, packaged semiconductor devices, and methods of packaging semiconductor devices are disclosed in the present disclosure. The interconnect structures include ground-up connector coupling regions in areas with high reliability and stress risks, and non-ground-up connector coupling regions in other areas. The interconnect structures are utilized in packages and packaged semiconductor devices. In some embodiments, POP devices are formed, wherein two packaged semiconductor devices are coupled together. One of the packaged semiconductor devices includes the interconnect structure described herein. One of the semiconductor devices comprises a fan-out structure and the other semiconductor device comprises a packaged dynamic random access memory (DRAM) device in some embodiments, to be described further herein.

FIG. 1A is a cross-sectional view that illustrates a first connector coupling region 100 of an interconnect structure 122*a* in accordance with some embodiments of the present disclosure. The interconnect structure 122*a* comprises a plurality of dielectric layers 101*a* and 101*b*. The dielectric layers 101*a* and 101*b* may each comprise a plurality of insulating material layers. The dielectric layers 101*a* and 101*b* may comprise a material such as silicon nitride (SiN), silicon dioxide ($SiO_2$), silicon oxynitride (SiON), low dielectric constant (k) materials having a k value less than a k value of silicon dioxide, which is about 3.9, passivation materials such as polyimide (PI), benzocyclobutene (BCB), polybenzoxazole (PBO), or epoxy, other insulating materials, or combinations or multiple layers thereof, as examples. In some embodiments, dielectric layer 101*a* comprises a plurality of insulating material layers, and dielectric layer 101*b* comprises a single insulating material layer that is formed after a connector 114 is coupled to the interconnect structure 122*a*.

A conductive layer 102 is disposed within dielectric layer 101*a*. The conductive layer 102 comprises a plurality of contact pads 104 formed using a patterning and deposition process over one of the plurality of insulating material layers of the dielectric layer 101*a*. The conductive layer 102 may also include conductive lines or traces 105 coupled to the contact pads 104 or adjacent the contact pads 104, for example. The contact pads 104 may comprise aluminum (Al), copper (Cu), tin (Sn), nickel (Ni), gold (Au), silver (Ag), other electrically conductive materials, or multiple layers or combinations thereof, as examples. The contact pads 104 may be formed using an electrolytic plating or electro-less plating process, for example. The size, shape, and location of the contact pads 104 in the figures are only for illustration purposes. A plurality of the contact pads 104 are formed on the interconnect structure 122*a*. The contact pads 104 may be of the same size or of different sizes. The contact pad 104 shown in FIG. 1A is also referred to herein as a first contact pad 104.

A via layer 106 is disposed in dielectric layer 101*a* proximate the conductive layer 102. The via layer 106 may include a plurality of conductive vias (not shown) formed therein, for example. The via layer 106 is an adjacent layer to the conductive layer 102 within the interconnect structure 122*a* in some embodiments. The via layer 106 also includes metallization 108 for a contact pad 115 in the first connector coupling region 100. The vias and metallization 108 in the via layer 106 may be formed using a damascene process, by patterning the dielectric layer 101*a* and filling the patterns with conductive material.

Figure 10:
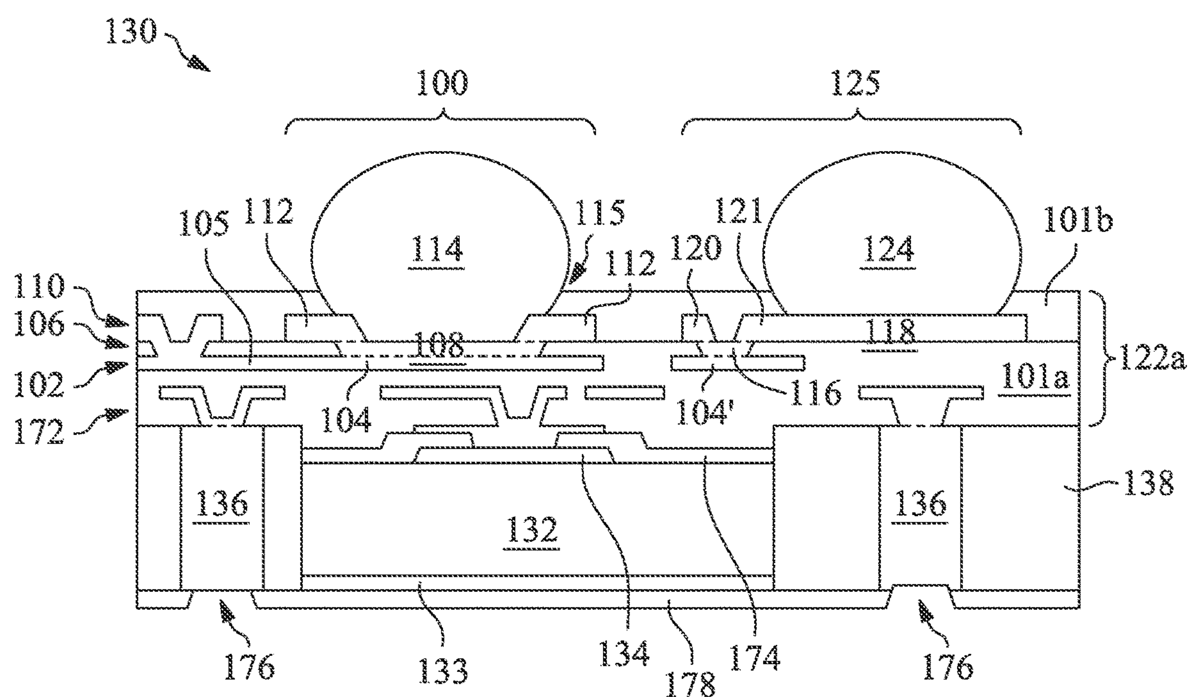
FIG. 10 is a cross-sectional view of a portion of a packaged semiconductor device that illustrates some additional material layers and features of an interconnect structure in accordance with some embodiments.

The interconnect structure 122*a* may include one or more additional conductive layers including conductive lines and via layers including conductive vias formed in dielectric layers beneath dielectric layer 101*a*, not shown in FIG. 1 (see FIG. 10).

Referring again to FIG. 1, an underball metallization (UBM) layer 110 is disposed in the plurality of dielectric layers 101*a* and 101*b* proximate the via layer 106. The UBM layer 110 is disposed in an adjacent layer to the via layer 106 within the interconnect structure 122*a* in some embodiments. The UBM layer 110 is disposed in dielectric layer 101*b* in FIG. 1, for example. The UBM layer 110 includes metallization 112 that is formed simultaneously with vias and metallization 108 in the via layer 106 in some embodiments. A conductive material such as copper, copper alloys, or other conductive materials may be formed over the patterned top-most dielectric material of the plurality of dielectric layers 101*a*, and the conductive material is patterned with a desired pattern for the metallization 112 in the UBM layer 110, also leaving the metallization 108 in the via layer 106, for example. The metallization 108/112 comprises a contact pad 115 in some embodiments. The contact pad 115 is also referred to herein as a ground-up UBM pad 115.

The interconnect structure 122*a* may comprise a redistribution layer (RDL) that provides electrical connections in a horizontal direction for a package or a packaged semiconductor device in some embodiments, for example. The interconnect structure 122*a* may also comprise other types of interconnect structures, such as a post passivation interconnect (PPI) structure, as an example.

A connector such as the first connector 114 shown in FIG. 1 is coupleable to the interconnect structure 122*a*. The first connector 114 is coupled to the contact pad 115 of the interconnect structure 122*a* in FIG. 1, for example. The first connector 114 comprises a eutectic material such as solder that is adapted to melt at a predetermined temperature, for example. The first connector 114 may comprise solder balls or solder bumps in some embodiments, as examples. The first connector 114 may also comprise other types of connection devices, such as conductive bumps, conductive balls, conductive pillars, non-spherical connectors, or other connectors. The first connector 114 may be coupled to the contact pad 115 using a ball drop process, solder bath, or other process. The first connector 114 comprises a diameter or width of about 150 μm to about 300 μm, or about 180 μm to about 250 μm, as examples. The first connector 114 may also comprise other materials, types of connectors, formation methods, and dimensions.

The material of the upper dielectric layer 101*b* is then applied to a predetermined height along the sides of the first connector 114. The upper dielectric layer 101*b* may also be formed before the first connector 114 is coupled to the interconnect structure 122*a*. An opening is formed in the dielectric layer 101*b* above the contact pad 115 after the dielectric layer 101*b* is applied, using lithography, a laser, or other methods. The connector 114 is attached to the contact pad 115 through the opening in the dielectric layer 101*b*.

The first connector coupling region 100 comprises a ground-up connector coupling region in some embodiments. The contact pad 115 of the first connector coupling region 110 comprises metallization 112 in the UBM layer 110 and metallization 108 in the via layer 106 that provide a region for coupling a first connector 114 to the interconnect structure 122*a*. The first connector coupling region 110 and the contact pad 115 are referred to herein as “ground-up” because the metallization 108 in the via layer 106 of the contact pad 115 is disposed directly over a contact pad 104 in the conductive layer 102, for example. Thus, the first connector 114 is formed directly over the contact pad 104. The first connector coupling region 100 is also referred to herein as a ground-up connector coupling region, and the ground-up connector coupling region 100 includes a contact pad 115 comprising a ground-up UBM pad 115.

Figure 1B:
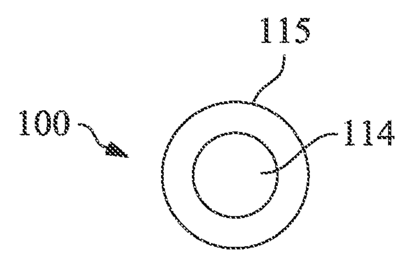
FIG. 1B is a top view of the first connector coupling region shown in FIG. 1A.

FIG. 1B is a top view of the first connector coupling region 100 shown in FIG. 1A. The first connector 114 disposed directly over the contact pad 115 is illustrated. The first connector 114 and the contact pad 115 comprise a shape of a circle in FIG. 1B: the first connector 114 and the contact pad 115 may also comprise other shapes. Dielectric layer 101*b* is not shown in FIG. 1B.

Figure 2A:
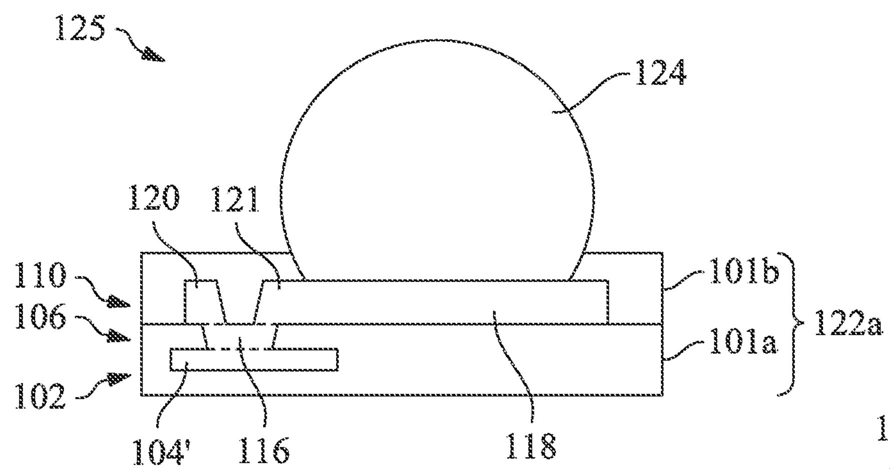
FIG. 2A is a cross-sectional view that illustrates a second connector coupling region of an interconnect structure in accordance with some embodiments.

FIG. 2A is a cross-sectional view that illustrates a second connector coupling region 125 of an interconnect structure 122*a* in accordance with some embodiments. Portions of the second connector coupling region 125 are formed in the same material layers as described for the first connector coupling region 100, such as in dielectric layers 101*a*/101*b*, conductive layer 102, via layer 106, and UBM layer 110. However, the second connector coupling region 125 comprises a different structure than the first connector coupling region 100. The second connector coupling region 125 comprises a non-ground-up connector coupling region in some embodiments. For example, a second connector 124 coupled to the interconnect structure 122*a* is not coupled directly over a contact pad 104 in the conductive layer 102. Rather, the second connector 124 is disposed over and is coupled to a PPI pad 118 formed in the UBM layer 110. The second connector 124 comprises similar materials, types of connectors, formation methods, and dimensions as described for the first connector 114 shown in FIGS. 1A and 1B.

The PPI pad 118 in the second connector coupling region 125 is coupled to a second contact pad 104' in the conductive layer 102 by a conductive segment comprised of a PPI line 120 and a transition element 121 in the UBM layer 110 and a via region 116 in the via layer 106. The second connector coupling region 125 is also referred to herein as a non-ground-up connector coupling region, and the non-ground-up connector coupling region 125 includes the PPI pad 118.

Figure 2B:
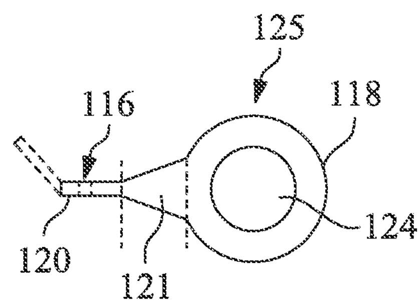
FIG. 2B is a top view of the second connector coupling region shown in FIG. 2A.

FIG. 2B is a top view of the second connector coupling region 125 shown in FIG. 2A. The transition element 121 disposed between the PPI pad 118 and the PPI line 120 may comprise a substantially triangular shape in the top view. The transition element 121 may also comprise other shapes. The conductive segment that includes the PPI line 120 also includes a via region 116 that extends into the via layer 106 and makes electrical contact with the contact pad 104'. The PPI line 120 may comprise a substantially straight line, or the PPI line 120 may comprise a meandering line, as shown in phantom (e.g., in dashed lines) in FIG. 2B. The second connector 124 and the PPI pad 118 comprise a shape of a circle in FIG. 2B: the second connector 124 and the PPI pad 118 may also comprise other shapes. Dielectric layer 101*b* is not shown in FIG. 2B.

The first connectors 114 and the second connectors 124 comprise the same materials and are formed simultaneously on an interconnect structure 122*a*. The first connectors 114 and the second connectors 124 have different element numbers in the present disclosure because the first connectors 114 and the second connectors 124 are coupled to different types of connector coupling regions and contact pads (i.e., the first connector coupling regions 100 and ground-up UBM pads 115, and the second connector coupling regions 125 and PPI pads 118, respectively).

Figure 3:
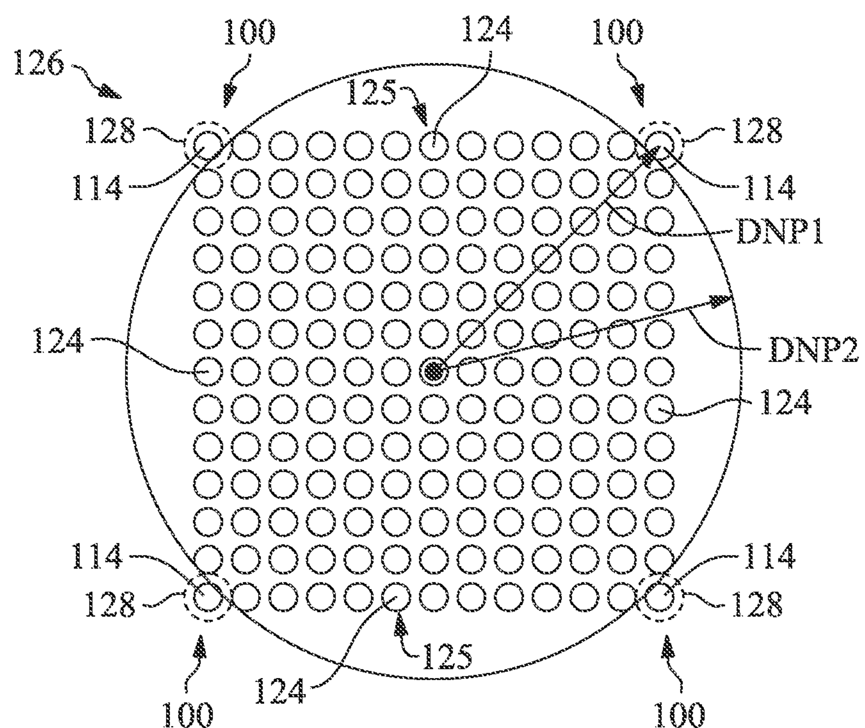
FIG. 3 is a bottom view that shows a plurality of connectors of an interconnect structure in accordance with some embodiments.

FIG. 3 is a bottom view that shows a plurality of connectors 114 and 124 of an interconnect structure 122*a* in accordance with some embodiments. The first and second connectors 114 and 124 are coupled to first connector coupling regions 100 and second connector coupling regions 125, respectively, as illustrated in FIGS. 1A, 1B, 2A, and 2B. Each first connector 114 is coupled to a ground-up UBM pad 115 (not shown in FIG. 3; see FIGS. 1A and 1B) in the first connector coupling regions 100, and each second connector 125 is coupled to a PPI pad 118 (also not shown in FIG. 3; see FIGS. 2A and 2B) in the second connector coupling regions 125. The connectors 114 and 124 are arranged in an array 126 of rows and columns. The array 126 is fully populated in the embodiments shown in FIG. 3: the array 126 may also be partially populated with various patterns in other embodiments. The array 126 may be formed as a grid, referred to as a "ball grid array" or "BGA". The array 126 may also be arranged in other shapes.

The first connector coupling regions 100 and first connectors 114 are disposed in corners 128 of the array 126 in the embodiments shown in FIG. 3. The first connector coupling regions 100 and first connectors 114 may also be disposed in other areas of the array 126, which will be described further herein with respect to FIGS. 5, 6, 7, and 9. The second connector coupling regions 125 and second connectors 124 are formed in other areas or regions of the array 126 than the corners 128. For example, the second connector coupling regions 125 and second connectors 124 are formed in non-corners of the array 126 in the embodiments shown.

In some embodiments, the first connector coupling regions 100 that comprise the ground-up connector coupling regions are placed in areas of the array 126 that are determined to have relatively high stress levels and/or reliability risk issues. For example, stress levels of a package (e.g., of the interconnect structure 122*a* of a packaged semiconductor device) may be analyzed to determine which locations in the array 126 to place the first connector coupling regions 100 in. Likewise, reliability risk of a package or interconnect structure 122*a* may be analyzed to determine which locations in the array 126 to place the first connector coupling regions 100.

In some embodiments, an analysis of a distance from a neutral position or point NP to connector locations of the array 126 may be made to determine if a higher likelihood of cracking or breaking of connections, higher thermal or mechanical stress, and/or higher reliability risks of the connector locations exists, in order to determine which regions of the array 126 of connector locations would benefit from placement of the first connector coupling regions 100 that comprise the ground-up connector coupling regions. For example, a desired value of a distance to the neutral point (see DNP2 in FIG. 3) for connector locations in the array 126 may be determined, and a measurement or estimate of the actual distances to the neutral point NP to each of the connector locations may be made. The neutral position NP may comprise a center of the array 126 of connectors 114 and 124 in some embodiments. The NP may also be located elsewhere in the array 126. Connector locations having a distance to the neutral point measurement or estimate (DNP1 in FIG. 3) that is greater than the predetermined desired value of the distance to the neutral point DNP2, such as the corners 128 of the array 126 in FIG. 3, may be designed to include first connector coupling regions 100 that comprise the ground-up connector coupling regions, for example. In areas of the array 126 other than the corners 128, the second connector coupling regions 125 and second connectors 124 are formed. These locations for the second connector coupling regions 125 and second connectors 124 in a central region and edge regions of the array 126 have a DNP measurement or estimate that is less than or equal to DNP2, for example.

The ground-up UBM pads 115 are robust and are adapted to withstand high thermal and mechanical stress, being coupled directly over contact pads 104 in the underlying conductive layer 102. Thus, by placing the ground-up connector coupling regions 100 comprising the ground-up UBM pads 115 in areas of the array 126 that are determined to have relatively high stress levels and/or reliability risk issues, reliability and yields of the interconnect structure 122*a* and package are advantageously improved.

In some embodiments, the interconnect structure 122*a* comprises a portion of a packaging device. The first connector coupling regions 100 are located in a first region of the packaging device comprising a first amount of stress (i.e., in a corner 128), and the second connector coupling regions 125 are located in a second region of the packaging device comprising a second amount of stress (i.e., an area of the packaging device not in a corner), wherein the first amount of stress is greater than the second amount of stress, for example. In some embodiments, the first connector coupling regions 100 comprise a first DNP, such as DNP1, and the second connector coupling regions comprise a second DNP, such as DNP2, wherein the first DNP is greater than the second DNP, as another example.

Figure 4:
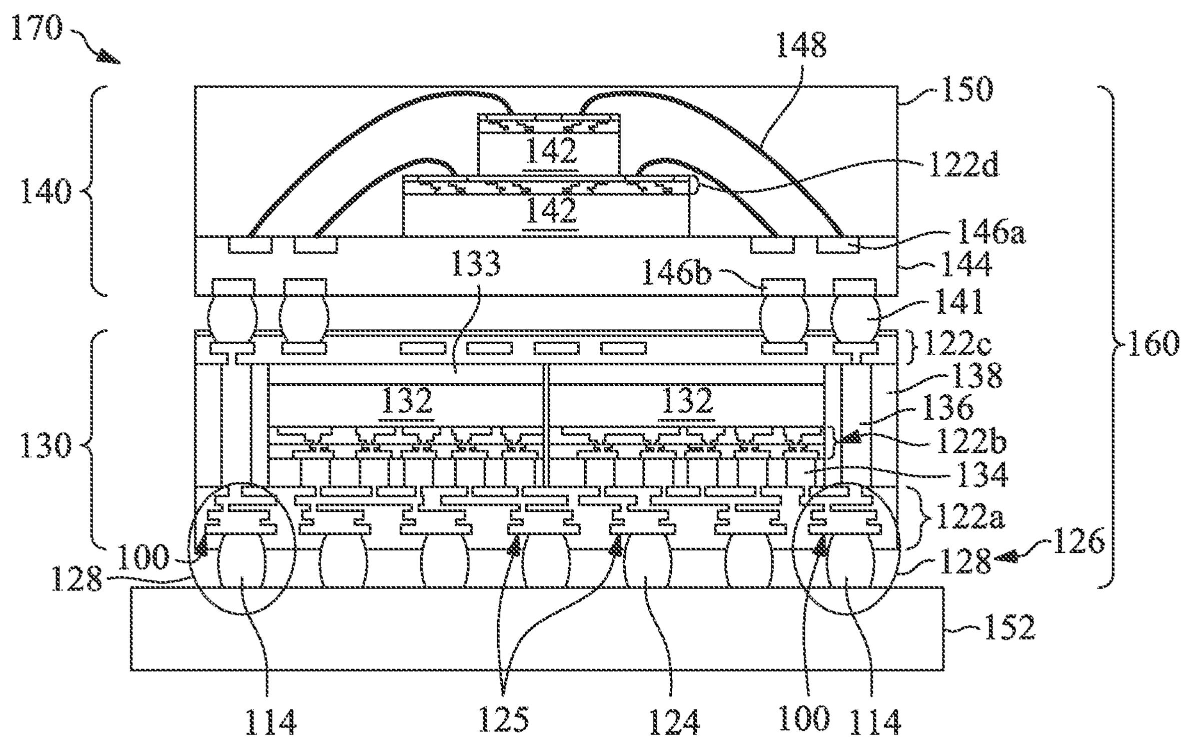
FIG. 4 is a cross-sectional view that illustrates a package-on-package (POP) device in accordance with some embodiments that includes the plurality of connectors coupled to a plurality of first connector coupling regions and a plurality of second connector coupling regions.

FIG. 4 is a cross-sectional view that illustrates a POP device 160 in accordance with some embodiments that includes a plurality of the first and second connectors 114 and 124 coupled to the plurality of first connector coupling regions 100 and the plurality of second connector coupling regions 125, respectively. The POP device 160 includes a second packaged semiconductor device 140 coupled to a first packaged semiconductor device 130 by a plurality of third connectors 141. The third connectors 141 comprise similar materials, connector types, dimensions, and formation methods as described for the first connectors 114. The POP device 160 may be coupled to a substrate 152 to form a chip-on-wafer-on-substrate (CoWoS) device 170 in some embodiments, which is also shown in FIG. 4.

The first packaged semiconductor device 130 includes a first interconnect structure 122*a* that includes the second connector coupling regions 125 that include the PPI pads 118 (not labelled in FIG. 4; see FIG. 2A) in central regions and regions other than the corners 128 of the array 126, and first connector coupling regions 100 that include the ground-up UBM pads 115 (not labelled in FIG. 4; see FIG. 1A) in the corners 128 of the array 126. The first packaged semiconductor device 130 comprises one or more integrated circuit dies 132 (two integrated circuit dies 132 are shown in FIG. 4) coupled to the first interconnect structure 122*a*, and a molding material 138 disposed around the integrated circuit dies 132 and over the first interconnect structure 122*a*. A plurality of through-vias 136 is disposed within the molding material 138 and is coupled to the first interconnect structure 122*a*.

The first packaged semiconductor device 130 includes a second interconnect structure 122*c* that is coupled to the integrated circuit dies 132, the molding material 138, and the plurality of through-vias 136. The second interconnect structure 122*c* comprises an RDL, PPI structure, or other type of interconnect structure that is formed over the molding material 138, the plurality of through-vias 136, and the integrated circuit dies 132. The second interconnect structure 122*c* comprises similar material layers, materials, and features as described for the first interconnect structure 122*a*, for example, such as dielectric layers 101*a*/101*b*, conductive layers 102, via layers 106, and UBM layers 110 (not labelled in the second interconnect structure 122*c*). The second interconnect structure 122*c* may also comprise the same or different material layers, materials, and features as described for the first interconnect structure 122*a*. The second interconnect structure 122*c* provides electrical connections in a horizontal direction for the first packaged semiconductor device 130 in some embodiments, for example. The first interconnect structure 122*a* comprises front-side routing, and the second interconnect structure 122*c* comprises back-side routing (i.e., relative to the integrated circuit dies 132) for the packaged semiconductor devices 130 in some embodiments.

The first interconnect structure 122*a* is coupled to a first side (e.g., the bottom side in FIG. 4) of the integrated circuit dies 132, the molding material 138, and the plurality of through-vias 136, and the second interconnect structure 122*c* is coupled to a second side (e.g., the top side in FIG. 4) of the integrated circuit dies 132, the molding material 138, and the plurality of through-vias 136. The second side of the integrated circuit dies 132, the molding material 138, and the plurality of through-vias 136 is opposite the first side.

In some embodiments, to package the semiconductor devices comprising the integrated circuit dies 132, the first interconnect structure 122*a* may be formed first, and the through-vias 136, integrated circuit dies 132, and the molding material 138 are formed over the first interconnect structure 122*a*. Then, the second interconnect structure 122*c* is formed. In other embodiments, the second interconnect structure 122*c* may be formed first, and the through-vias 136, integrated circuit dies 132, and the molding material 138 are formed over the second interconnect structure 122*c*. Then, the first interconnect structure 122*a* is formed.

One or more carriers (not shown) may be used to package the integrated circuit dies 132 in the first packaged semiconductor device 130, for example. The first interconnect structure 122*a*, the second interconnect structure 122*c*, or both, may be formed on a carrier, for example, and then the other material layers and elements are formed or attached. The carrier may comprise a wafer or other type of substrate that is used for the packaging process as a platform for packaging the plurality of integrated circuit dies 132. The carrier(s) may also comprise a carrier tape. The carrier(s) are removed after the packaging process for the first packaged semiconductor device 130 is completed. A plurality of first packaged semiconductor devices 130 may be formed over a carrier and processed. Dozens, hundreds, or more first packaged semiconductor devices 130 may be formed over a carrier in an array of rows and columns, for example. The plurality of first packaged semiconductor devices 130 are singulated, before or after coupling a second packaged semiconductor device 140 to each of the first packaged semiconductor devices 130, for example. In other embodiments, the first packaged semiconductor devices 130 are not coupled to another packaged device, and the first packaged semiconductor devices 130 are used in an end application by coupling them in the end application using the first and second connectors 114 and 124.

Although two integrated circuit dies 132 are shown in FIG. 4, a single integrated circuit die 132 or three or more integrated circuit dies 132 may be included in a first packaged semiconductor device 130, for example. Each of the plurality of integrated circuit dies 132 includes an interconnect structure 122*b* formed thereon and contacts 134 disposed on a bottom surface thereof which are formed in an insulating material. In some embodiments, the contacts 134 comprise copper vias and the insulating material comprises PBO, as examples. The contacts 134 and insulating material may also comprise other materials. The plurality of integrated circuit dies 132 may comprise logic devices, processors, or other devices, as example. The integrated circuit dies 134 initially are in wafer form and are separated using a saw along scribe lines. The plurality of integrated circuit dies 132 may be placed on the first interconnect structure 122*a* (or on the second interconnect structure 122*c*) using a pick-and-place machine or manually, for example. The contacts 134 are electrically connected to portions of the first interconnect structure 122*a* such as to contact pads or vias of the first interconnect structure 122*a*, e.g., using a eutectic material such as solder in embodiments wherein the first interconnect structure 122*a* is first formed, or using a die attach film (DAF) 133, in embodiments wherein the second interconnect structure 122*c* is first formed, as examples. The integrated circuit die or dies 132 may also be attached or coupled to the first and second interconnect structures 122*a* and 122*c* using other methods.

The plurality of through-vias 136 may be formed over the first interconnect structure 122*a* or over the second interconnect structure 122*c* by plating, photolithography, or other methods, before or after the integrated circuit dies 132 are coupled to the first interconnect structure 104*a* or over the second interconnect structure 122*c*. In some embodiments, first, the plurality of through-vias 136 is plated over the first interconnect structure 122*a* or over the second interconnect structure 122*c*, and second, the integrated circuit dies 132 are attached to the first interconnect structure 122*a* or to the second interconnect structure 122*c*, for example. The plurality of through-vias 136 may be formed using an electroplating process, by depositing an insulating material (not shown) over the interconnect structure 122*a* or 122*c*, and patterning the insulating material with a desired pattern for the through-vias 136. The through-vias 136 are plated onto the interconnect structure 122*a* or 122*c* through the patterned insulating material, and the insulating material is then removed. A seed layer may be formed before the plating process, for example. The through-vias 136 may comprise copper, a copper alloy, other metals, or other materials. Dozens or hundreds of through-vias 136 may be included in a package for each of the integrated circuit dies 132 or groups of integrated circuit dies 132 that are packaged together, for example. The plurality of through-vias 136 provides electrical connections in a vertical direction for the packaged semiconductor devices in some embodiments. Each of the plurality of through-vias 136 may be coupled to a conductive via, contact pad, or conductive line of the first interconnect structure 122*a* or the second interconnect structure 122*c*, for example.

The molding material 138 is disposed between the through-vias 136 and integrated circuit dies 132 and between adjacent ones of the plurality of through-vias 136 and integrated circuit dies 132. The molding material 138 comprises a molding compound comprised of an insulating material, such as an epoxy, a filler material, a stress release agent (SRA), an adhesion promoter, other materials, or combinations thereof, as examples. The molding material 138 comprises a liquid or gel when applied so that it flows between and around the plurality of through-vias 136 and integrated circuit dies 132, in some embodiments. The molding material 138 is then cured or allowed to dry so that it forms a solid. As deposited, the molding material 138 may extend over top surfaces of the integrated circuit dies 132 and the plurality of through-vias 136. In accordance with some embodiments, after the molding material 138 is applied, a top portion of the molding material 138 is removed using a planarization process, such as a CMP process, a grinding process, an etch process, or combinations thereof, as examples. Other methods may also be used to planarize the molding material 138. A top portion of the integrated circuit dies 132 and/or through-vias 136 may also be removed during the planarization process for the molding material 138.

After the planarization process for the molding material 138, the second interconnect structure 122*c* (or the first interconnect structure 122*a*, in embodiments wherein the second interconnect structure 122*c* is first formed) is then formed over the molding material 138, through-vias 136, and the integrated circuit dies 132.

The first packaged semiconductor devices 130 comprise fan-out structures in some embodiments. For example, the conductive wiring is spaced out farther in the first and second interconnect structures 122*a* and 122*c* than conductive wiring is spaced in the interconnect structure 122*b* of the integrated circuit dies 132. Likewise, the footprint of contact pads in or on the first and second interconnect structures 122*a* and 122*c* is larger than the footprint of the contacts 134 of the integrated circuit dies 132.

A first connector 114 is coupled to each of the first connector coupling regions 100 in the corners 128 of the interconnect structure 122*a* and first packaged semiconductor device 130. Likewise, a second connector 124 is coupled to each of the second connector coupling regions 125 in regions of the array 126 other than the corners 128. The connectors 114 and 124 may be coupled to the first interconnect structure 122*a* at various points in the packaging process, such as after the packaging process, before the formation of the molding material 138, attachment of the integrated circuit dies 132 and/or through-vias 136, or formation of the second interconnect structure 122*c*, as examples.

The packaging process flow for packaging integrated circuit dies 102*a* and forming packaged semiconductor devices 130 may also comprise other processing steps and orders of the processing steps.

In some embodiments, after the packaging process is complete for the first packaged semiconductor device 130, a plurality of the packaged semiconductor devices 130 is singulated along scribe lines to form a plurality of separated first packaged semiconductor devices 130. The packaged semiconductor devices 130 may be singulated using a saw, which may include a blade comprising diamond or other materials in some embodiments, for example. In other embodiments, the first packaged semiconductor devices 130 are singulated after second packaged semiconductor devices 140 are attached.

In some embodiments wherein the second packaged semiconductor devices 140 are coupled to the first packaged semiconductor devices 130 using connectors 141 to form a POP device 160 shown in FIG. 4, before the packaged semiconductor devices 130 are singulated, a plurality of the second packaged semiconductor devices 140 is provided, and each of the plurality of second packaged semiconductor devices 140 is coupled to one of the first packaged semiconductor devices 130 using the plurality of third connectors 141 coupled to the second interconnect structure 122*c* of the first packaged semiconductor devices 130, coupled to the second packaged semiconductor devices 140, or coupled to both the first packaged semiconductor devices 130 and the second packaged semiconductor devices 140. The plurality of second packaged semiconductor devices 140 may include integrated circuit dies 142 that have been encapsulated with protective materials, and electrical wiring structures may be coupled to the integrated circuit dies 142, to be described further herein. The second packaged semiconductor devices 140 are coupled to the unsingulated first packaged semiconductor devices 130 by a method such as manually by an operator or technician, the use of an automated machine such as a pick-and-place machine, or other methods. The plurality of first packaged semiconductor devices 130 is then singulated to form the POP devices 160.

Each of the plurality of second packaged semiconductor devices 140 may comprise a substrate 144 that includes a plurality of contact pads 146*a* and 146*b* disposed on. The substrate 144 may include one or more interconnect structures (not shown) formed thereon that provide horizontal connections for the plurality of second packaged semiconductor devices 140 in some embodiments. The substrate 144 may also include a plurality of through-vias (also not shown) formed therein. One or more integrated circuit dies 142 may be coupled to a top surface of the substrate 144. Each of the plurality of second packaged semiconductor devices 140 comprises two vertically stacked integrated circuit dies 142 in the embodiments shown in FIG. 4, for example. Two or more integrated circuit dies 142 may also be packaged together horizontally in the second packaged semiconductor devices 140 in some embodiments, not shown.

In the embodiments shown, the integrated circuit dies 142 are coupled to contact pads 146*a* disposed on a top surface of the substrate 144 by bond wires 148. The bond wires 148 and through-vias in the substrate 144 provide vertical electrical connections for the plurality of second packaged semiconductor devices 140 in some embodiments. A molding material 150 is disposed over the integrated circuit dies 142, the bond wires 148, and the substrate 144. The molding material 150 may comprise similar materials as described for the molding material 138 of the first semiconductor device 130, for example. The molding material 138 of the first packaged semiconductor device 130 is also referred to herein as a first molding material 138, and the molding material 150 of the second packaged semiconductor device 140 is also referred to herein as a second molding material 150.

In some embodiments, the integrated circuit die or dies 142 comprise DRAM devices, for example. The integrated circuit dies 142 may also comprise other types of devices. One or more integrated circuit dies 142 may be included in the second packaged semiconductor devices 140. The integrated circuit dies 142 may be packaged together vertically as shown, or horizontally. The integrated circuit dies 142 may be packaged in a wire bond type of package as shown in FIG. 4, or the integrated circuit dies 142 may be packaged in other types of packages and using other types of packaging techniques.

After the second packaged semiconductor devices 140 are coupled to the first packaged semiconductor devices 130 using the plurality of third connectors 141, as shown in FIG. 4, a eutectic material of the connectors 141 is then reflowed and is allowed to cool, which mechanically and electrically couples the second packaged semiconductor device 140 to the first packaged semiconductor device 130. Each of the plurality of second packaged semiconductor devices 140 is coupled to one of the plurality of first packaged semiconductor devices 130 using some of the plurality of connectors 141, for example. The plurality of first packaged semiconductor devices 130 and the plurality of second packaged semiconductor devices 140 are arranged in an array of rows and columns in some embodiments. The POP devices 160 are then singulated along the scribe lines. The POP devices 160 may then be coupled to another device or object using the plurality of first and second connectors 114 and 124 disposed on the bottom surfaces of the POP device 160, e.g., using a surface mount technology (SMT) process.

Figure 5:
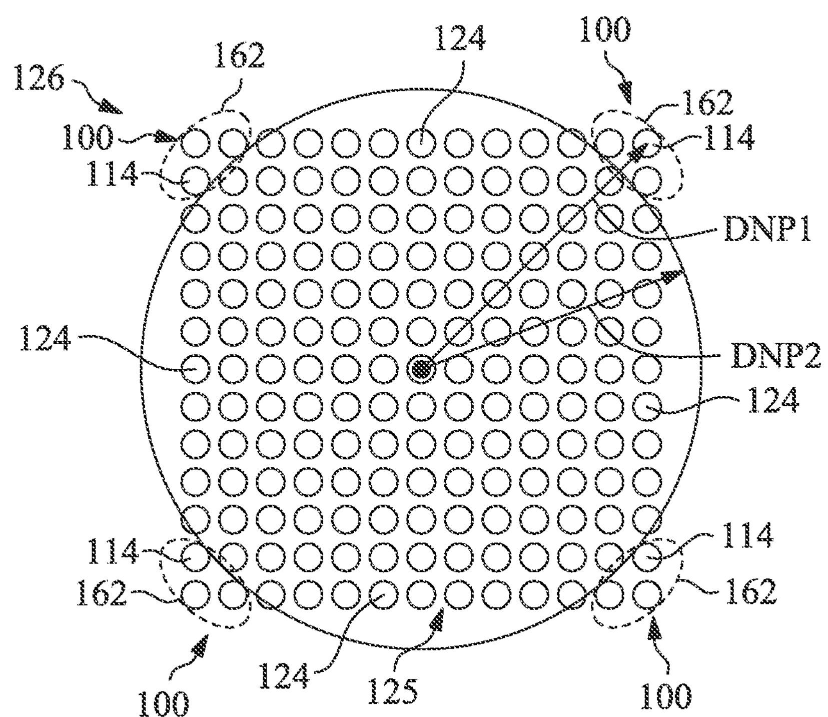
FIGS. 5, 6, and 7 are bottom views that show a plurality of connectors of an interconnect structure in accordance with some embodiments.
Figure 6:
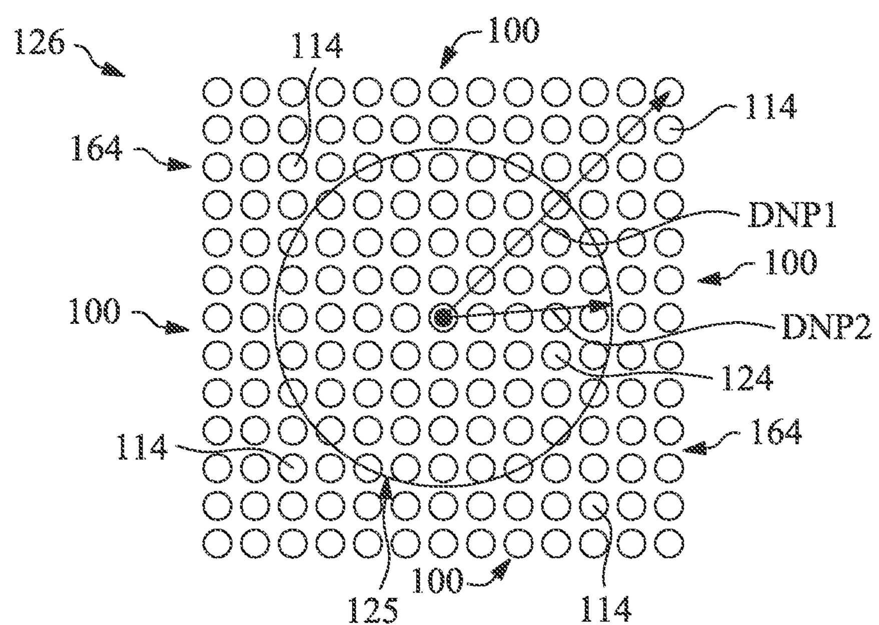
Figure 7:
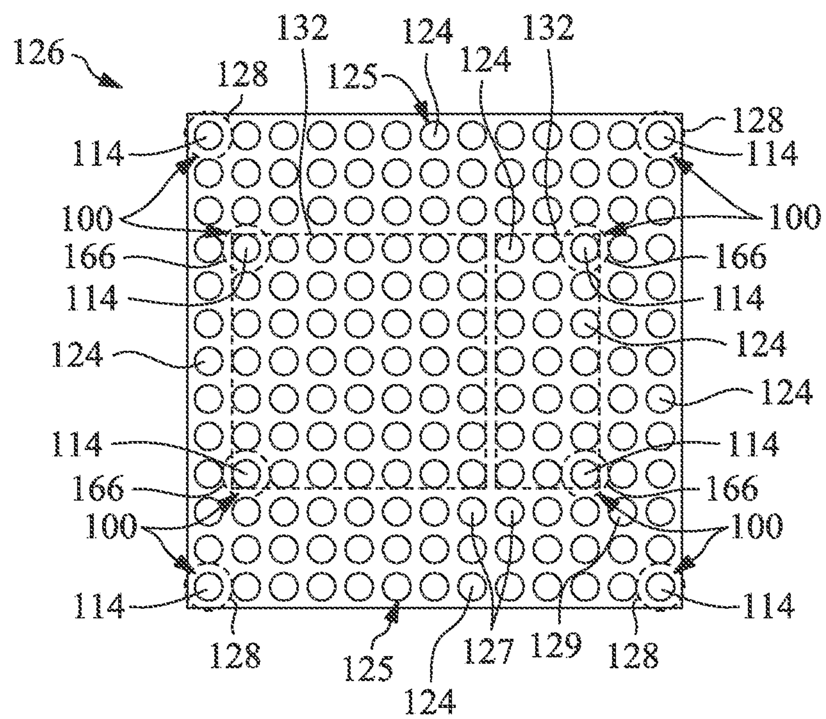

FIGS. 5, 6, and 7 are bottom views that show a plurality of connectors of an interconnect structure in accordance with some embodiments. Some embodiments are shown wherein the first connector coupling regions 100 that include the ground-up UBM pads 115 and first connectors 114 coupled to the ground-up UBM pads 115 are disposed in various regions of the array 126. In FIG. 5, the first connector coupling regions 100 that include the ground-up UBM pads 115 and first connectors 114 are disposed in corner regions 162 of the array 126. The other areas of the array 126 such as the central region and portions of the edge region that do not include the corner regions 162 include second connector coupling regions 125 that include the PPI pads 118 and second connectors 124 coupled to the PPI pads 118 disposed therein. The second connector coupling regions 125 are disposed in regions of the array 126 other than the corner regions 162, for example.

Each corner region 162 of the array 126 shown in FIG. 5 includes three first connector coupling regions 100 and three first connectors 114, for example. The corner regions 162 of the array 126 may also comprise other numbers of first connector coupling regions 100 and first connectors 114. The predetermined desired value of the distance to the neutral point DNP2 is less than the predetermined desired value of the distance to the neutral point DNP2 shown in FIG. 3, or the array 126 in FIG. 5 is larger than the array 126 in FIG. 3, as examples.

In FIG. 6, some embodiments of the present disclosure are shown wherein the predetermined desired value of the distance to the neutral point DNP2 is less than the predetermined desired value of the distance to the neutral point DNP2 shown in FIG. 5, or the array 126 in FIG. 6 is larger than the array 126 in FIG. 5. Thus, additional first connector coupling regions 100 are included in the array 126. The first connector coupling regions 100 that include the ground-up UBM pads 115 and first connectors 114 are disposed in corner regions and edge regions 164 of the array 126. Second connector coupling regions 125 that include the PPI pads 118 and second connectors 124 coupled to the PPI pads 118 are disposed in the other areas of the array 126, such as the central region of the array 126.

FIG. 7 illustrates some embodiments wherein the first connector coupling regions 100 are included in the array 126 proximate some of the corners 166 of the integrated circuit dies 132 coupled to the interconnect structure 122*a*. In some embodiments, the first connector coupling regions 100 that include the ground-up UBM pads 115 and first connectors 114 may be included in the array 126 only proximate some of the corners 166 of the integrated circuit die 132, not shown in the drawings. In other embodiments, as shown in FIG. 7, the first connector coupling regions 100 that include the ground-up UBM pads 115 and first connectors 114 are also disposed in the corners 128 of the array 126, in addition to proximate the corners 166 of the integrated circuit dies 132. In yet other embodiments, not shown, the first connector coupling regions 100 may also be disposed in the corner regions 162 of the array 126, as shown in FIG. 5, in addition to proximate the corners 166 of the integrated circuit dies 132. In other embodiments, also not shown, the first connector coupling regions 100 may also be disposed in the corner regions and edge regions 164 of the array 126, as shown in FIG. 6, in addition to proximate the corners 166 of the integrated circuit dies 132, as another example. Second connector coupling regions 125 that include the PPI pads 118 and second connectors 124 coupled to the PPI pads 118 are disposed in the other areas of the array 126 other than where the first connector coupling regions 100 are disposed or located.

In embodiments wherein two or more integrated circuit dies 132 are packaged together in a single package, the inner corner regions 127 may comprise lower stress and lower reliability risk, and first connector coupling regions 100 may not be required to be implemented in these locations. Rather, second connector coupling regions 125 may be used in the inner corner regions 127. The first connector coupling regions 100 may also be implemented in the inner corner regions 127, in other embodiments.

In some embodiments, the first connector coupling regions 100 are included in the array 126 for connector regions directly beneath the outer corners of the integrated circuit dies 132, as shown in FIG. 7. In other embodiments, the first connector coupling regions 100 are included in the array for connector regions near the outer corners of the integrated circuit dies 132. For example, connector region 129 comprises a connector region that is a first connector region outside the location of the integrated circuit die 132 corner. A first connector coupling region 100 is placed in this location, in some embodiments. The first connector coupling regions 100 may also be placed in other locations proximate the corners of the integrated circuit dies 132.

Figure 8:
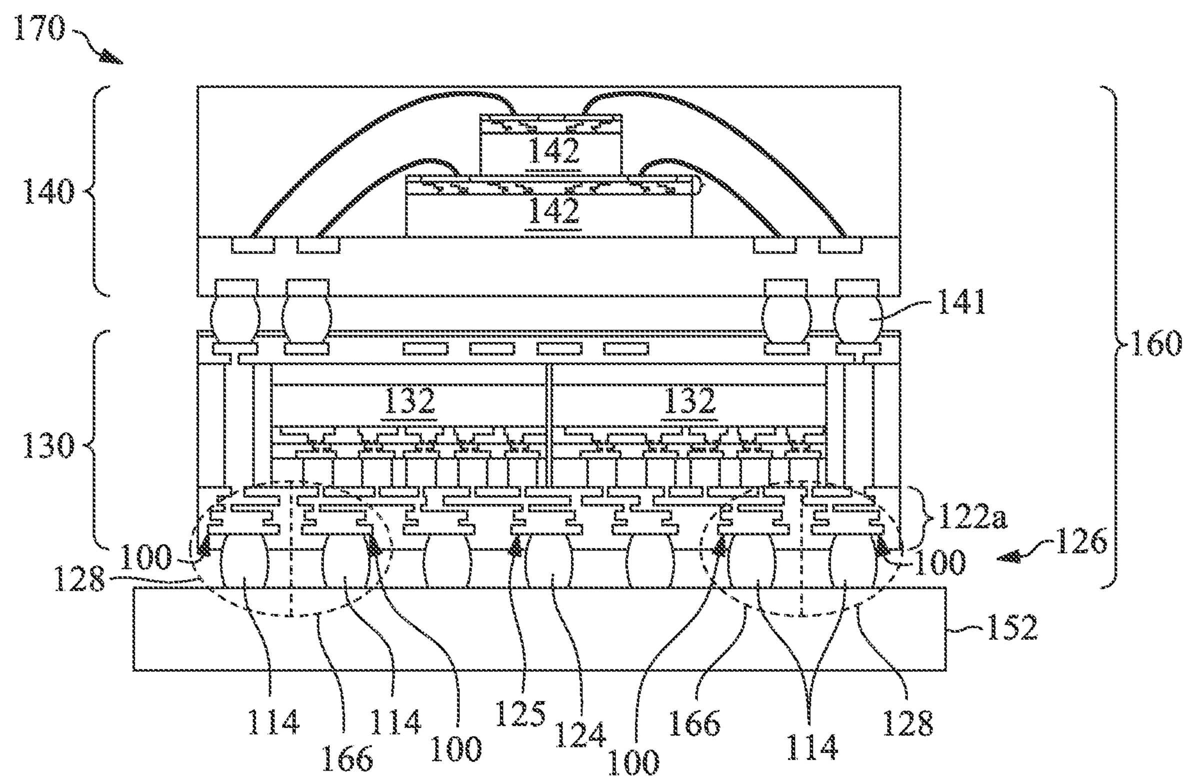
FIG. 8 is a cross-sectional view that illustrates a POP device in accordance with some embodiments.

FIG. 8 is a cross-sectional view that illustrates a POP device 160 and a CoWoS device 170 in accordance with some embodiments. Note that all of the elements of the first packaged semiconductor device 130 and the second semiconductor device 140 are not labeled in FIG. 8, in order to simplify the drawing: FIG. 4 may be referred to again for more detailed element numbers and descriptions thereof.

FIG. 8 illustrates the embodiments shown in FIG. 7 implemented in a first packaged semiconductor device 130. Corners 128 of the array 126, first interconnect structure 122*a*, and first packaged semiconductor device 130 include the first connector coupling regions 100 that include the ground-up UBM pads 115 and first connectors 114 that are coupled to the ground-up UBM pads 115. The first connector coupling regions 100 are also included in the array 126 proximate corners 166 of the integrated circuit dies 132. Second connector coupling regions 125 that include the PPI pads 118 and second connectors 124 coupled to the PPI pads 118 are disposed in the other areas of the array 126 where the first connector coupling regions 125 are disposed or located.

Figure 9:
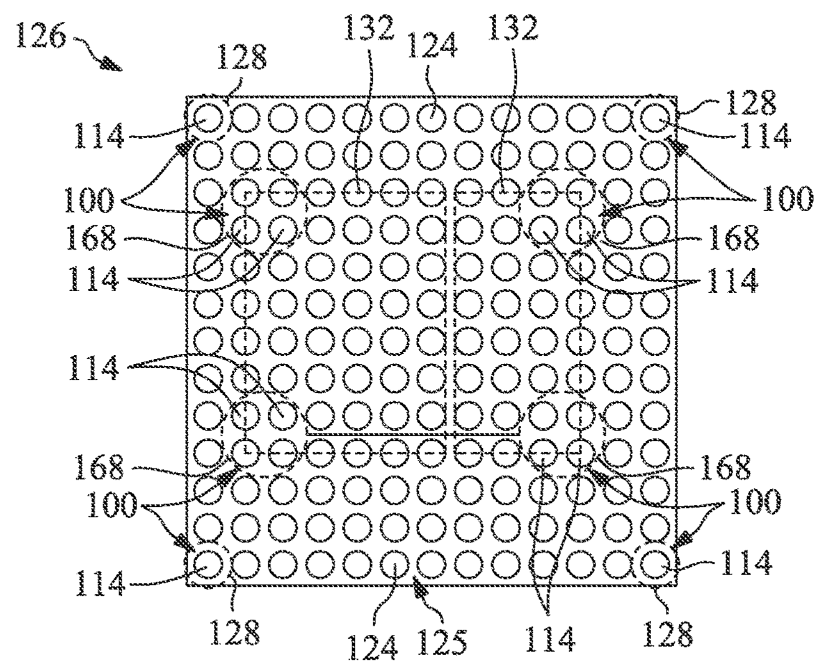
FIG. 9 is a bottom view that shows a plurality of connectors of an interconnect structure in accordance with some embodiments.

FIG. 9 is a bottom view that shows a plurality of connectors 114 and 124 of a first interconnect structure 122*a* in accordance with some embodiments. The first connector coupling regions 100 are included in the array 126 proximate corner regions 168 of the integrated circuit dies 132. Each corner region 168 of the integrated circuit dies 132 shown in FIG. 9 includes four first connector coupling regions 100 and four first connectors 114, for example. The corner regions 168 of the integrated circuit dies 132 may also comprise other numbers of first connector coupling regions 100 and first connectors 114. The two corner rows of connector locations closest to the outer corners of the integrated circuit dies 132 may include the first connector coupling regions 100 in some embodiments, for example.

In some embodiments, the first connector coupling regions 100 that include the ground-up UBM pads 115 and first connectors 114 may be included in the array 126 only proximate the corner regions 168 of the integrated circuit die 132, not shown in the drawings. In other embodiments, as shown in FIG. 9, the first connector coupling regions 100 that include the ground-up UBM pads 115 and first connectors 114 are also disposed in the corners 128, in addition to proximate the corner regions 168 of the integrated circuit dies 132. In yet other embodiments, not shown, the first connector coupling regions 100 may also be disposed in the corner regions 162 of the array 126, as shown in FIG. 5, in addition to proximate the corner regions 168 of the integrated circuit dies 132. In other embodiments, also not shown, the first connector coupling regions 100 may also be disposed in the corner regions and edge regions 164 shown in FIG. 6, in addition to proximate the corner regions 168 of the integrated circuit dies 132, as another example. Second connector coupling regions 125 that include the PPI pads 118 and second connectors 124 coupled to the PPI pads 118 are disposed in the other areas of the array 126 than where the first connector coupling regions 100 are disposed or located.

Note that the descriptions of the bottom views of the first interconnect structures 122*a* comprising an array 126 shown in FIGS. 3, 5, 6, 7, and 9 of the various areas where the first connector coupling regions 100 are located in the array 126 may also be used to described where the first connector coupling regions 100 are located in the interconnect structure 122*a*, the first packaged semiconductor device 130, a POP device 160, or a CoWoS device 170, because the array 126 comprises a component of the interconnect structure 122*a*, the first packaged semiconductor device 130, the POP device 160, and/or the CoWoS device 170, for example.

FIG. 10 is a cross-sectional view of a portion of a first packaged semiconductor device 130 that illustrates additional material layers of a first interconnect structure 122*a* in accordance with some embodiments. Conductive material layers 172 are disposed below the conductive layer 102 within the dielectric layers 101*a*, for example. The conductive material layers 172 include a plurality of conductive lines and vias, some of which are coupled to the through-vias 136 or the contacts 134 of the integrated circuit die 132. A passivation layer 174 comprising an insulating material is disposed over the integrated circuit die 132 and over portions of the contacts 134. An opening is formed in the passivation layer 174 so that electrical connection may be made to the contacts 134 by conductive lines and vias in the conductive material layer 172. Openings 176 are formed in a passivation layer 178 disposed over a back side of the integrated circuit die 132 and molding material 138, so that electrical connections may be made to the through-vias 136 by a subsequently formed second interconnect structure 122*c* (not shown in FIG. 10; see FIG. 4). FIG. 10 also illustrates that a first connector coupling region 100 may be formed adjacent a second connector coupling region 125 within an interconnect structure 122*a*.

Figure 11:
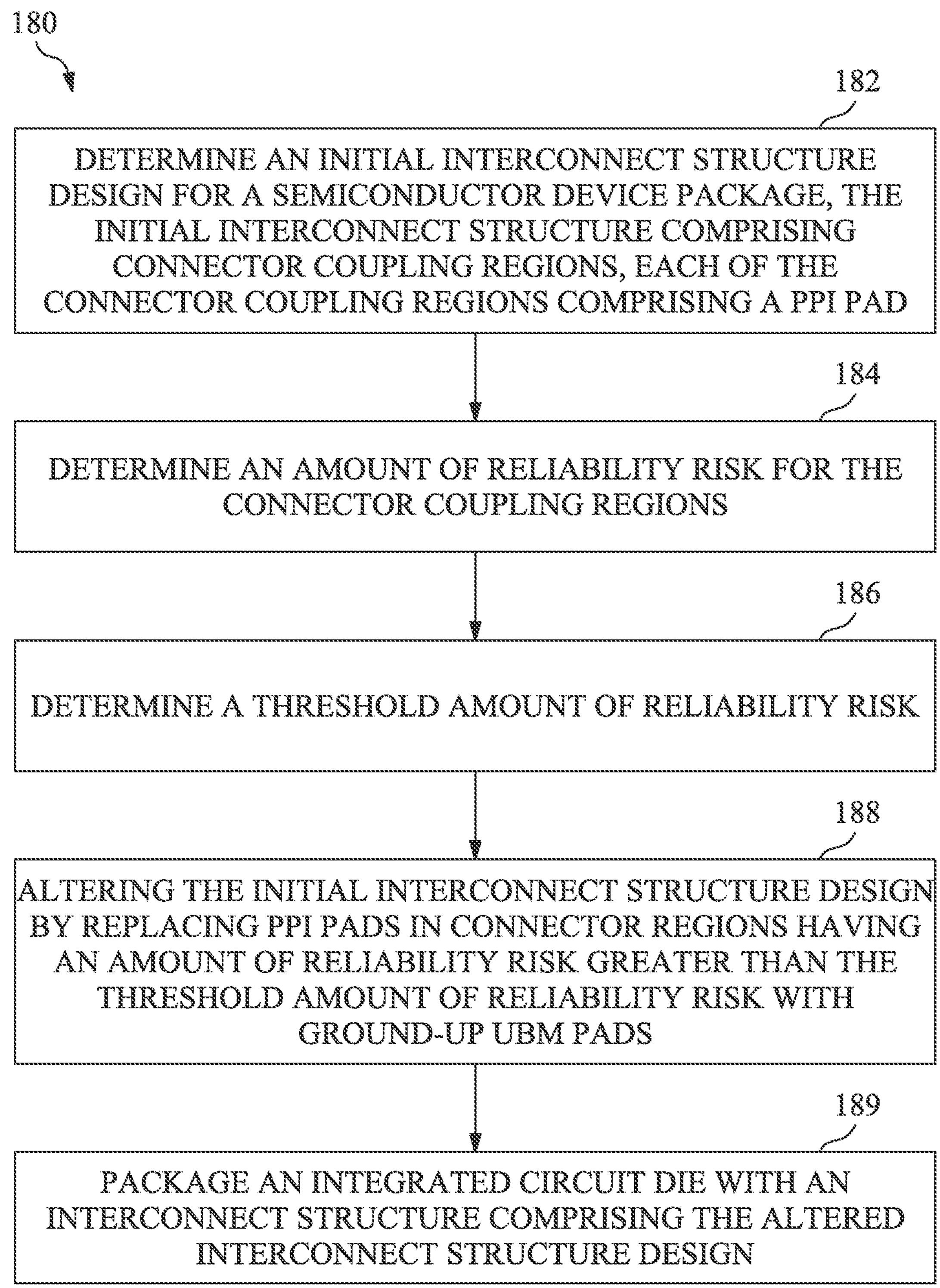
FIG. 11 is a flow chart illustrating a method of packaging a semiconductor device in accordance with some embodiments.

FIG. 11 is a flow chart 180 illustrating a method of packaging a semiconductor device in accordance with some embodiments. In step 182, an initial interconnect structure design for a semiconductor device package 130 is determined. The initial interconnect structure comprises connector coupling regions that each comprise a PPI pad 118. In step 184, an amount of reliability risk for each of the connector coupling regions is determined. For example, a measurement or estimate of the actual distances to the neutral point NP to each of the connector locations may be made, with the distances being indicative of an amount of reliability risk for each connector location. In step 186, a threshold amount of reliability risk is determined. As an example, a desired value of a distance to the neutral point (see DNP2 in FIGS. 3, 5, and 6) for connector locations in the array 126 may be determined based on a reliability risk factor determined. In step 188, the initial interconnect structure design is re-designed or altered, by replacing the PPI pads 118 in connector regions having an amount of reliability risk greater than the threshold amount (see DNP1 in FIGS. 3, 5, and 6) with ground-up UBM pads 115. In step 189, an integrated circuit die 132 is then packaged with an interconnect structure 122*a* comprising the altered interconnect structure design.

Embodiments of the present disclosure are advantageously implementable in and are particularly beneficial when used in POP devices, in some applications. The packaged semiconductor devices may comprise POP devices, system-on-a chip (SOC) devices, CoWoS devices, or other types of 3DICs in some embodiments, as examples.

In some embodiments, the first integrated circuit dies 132 comprise logic devices or processors and the first packaged semiconductor devices 130 comprise fan-out wiring, and the second integrated circuit dies 142 comprise memory devices such as DRAM devices, e.g., in some embodiments wherein the ground-up UBM pad and PPI pad placement described herein is implemented in an integration fan-out (InFO) POP device 160. In some embodiments, the second packaged semiconductor devices 140 include a plurality of stacked integrated circuit dies 142 comprising DRAM devices, for example. The first integrated circuit dies 132, the second integrated circuit dies 142, the first packaged semiconductor devices 130, and the second packaged semiconductor devices 140 may also comprise other types of devices, and the ground-up UBM pad 115 and PPI pad 118 placement and processes described herein may be implemented in other types of applications.

Some embodiments of the present disclosure include interconnect structures 122*a*, packaged semiconductor devices 130, POP devices 160, and CoWoS devices 170 that include the first connector coupling regions 100 that include ground-up UBM pads 115 in corners or corner regions of the interconnect structures 122*a* or package, while other areas include second connector coupling regions 125 that include PPI pads 118. Other embodiments include methods of packaging semiconductor devices using interconnect structures 122*a* that include first connector coupling regions 100 that include the ground-up UBM pads 115 in corners or corner regions of the interconnect structures 122*a* or packages, and second connector coupling regions 125 that include PPI pads 118 in other areas.

Advantages of some embodiments of the present disclosure include providing packaging methods for POP devices, CoWoS devices, and other types of 3DICs that have robust ground-up UBM pads in high reliability risk and stress locations, such as corners and corner regions of the package and/or proximate the corners or corner regions of integrated circuit dies in the package. Reliability and yields of the packaged devices are improved. Cracks in the interconnect structure and delamination of dielectric layers are reduced or eliminated by implementing the ground-up UBM pads in high reliability risk and stress locations. Damage to the packaged semiconductor devices from high stress levels that may be caused by thermal cycling during testing, transportation, or in an end application are also reduced or eliminated. Furthermore, the packaging methods and structures described herein are easily implementable into existing packaging process flows and structures.

The first connector coupling regions and first connectors described herein may be located in a corner of a packaged semiconductor device, a corner region of a packaged semiconductor device, an edge region of a packaged semiconductor device, proximate a corner or a corner region of an integrated circuit die within the packaged semiconductor device, or other locations. The second connector coupling regions are located in regions other than where the first connector coupling regions are located. For example, the second connector coupling regions and the second connectors described herein may be located in a region other than: a corner of a packaged semiconductor device, a corner region of a packaged semiconductor device, an edge region of a packaged semiconductor device, or proximate a corner or a corner region of an integrated circuit die within the package.

In some embodiments of the present disclosure, an interconnect structure includes a plurality of dielectric layers, a conductive layer disposed in the plurality of dielectric layers, and a via layer disposed in the plurality of dielectric layers proximate the conductive layer. The interconnect structure includes a UBM layer disposed in the plurality of dielectric layers proximate the via layer. A first connector coupling region is disposed in the via layer and the UBM layer, a via layer portion of the first connector coupling region being coupled to a first contact pad in the conductive layer. A second connector coupling region is disposed in the UBM layer, the second connector coupling region being coupled to a conductive segment in the UBM layer and the via layer. The second connector coupling region is coupled to a second contact pad in the conductive layer by the conductive segment.

In other embodiments, a packaged semiconductor device includes a molding material, an integrated circuit die disposed within the molding material, and a plurality of through-vias disposed within the molding material. An interconnect structure is coupled to the integrated circuit die, the molding material, and the plurality of through-vias. The interconnect structure includes a plurality of dielectric layers, a conductive layer disposed in the plurality of dielectric layers, a via layer disposed in the plurality of dielectric layers proximate the conductive layer, and a UBM layer disposed in the plurality of dielectric layers proximate the via layer. The interconnect structure includes a first connector coupling region disposed in the via layer and the UBM layer, a via layer portion of the first connector coupling region being coupled to a first contact pad in the conductive layer. The interconnect structure also includes a second connector coupling region disposed in the UBM layer, the second connector coupling region being coupled to a conductive segment in the UBM layer and the via layer. The second connector coupling region of the interconnect structure is coupled to a second contact pad in the conductive layer by the conductive segment. The packaged semiconductor device includes a first connector coupled to the first connector coupling region of the interconnect structure, and a second connector coupled to the second connector coupling region of the interconnect structure.

In yet other embodiments, a method of packaging a semiconductor device includes determining an initial interconnect structure design for a semiconductor device package, the initial interconnect structure comprising a plurality of connector coupling regions, each of the plurality of connector coupling regions comprising a PPI pad. An amount of reliability risk for the plurality of connector coupling regions is determined, and a threshold amount of reliability risk is determined. The method includes altering the initial interconnect structure design by replacing PPI pads in the plurality of connector coupling regions having an amount of reliability risk greater than the threshold amount with ground-up UBM pads. An integrated circuit die is then packaged with an interconnect structure comprising the altered interconnect structure design.

In yet other embodiments, a method of forming a semiconductor structure includes forming an interconnect structure, including depositing a conductive layer having a first contact pad and a second contact pad, depositing a first dielectric layer on the conductive layer, forming a ground-up underbump metallization (UBM) pad disposed on the first dielectric layer in a first region of the interconnect structure, the first region of the interconnect structure determined to be under a first amount of stress, a first portion of the ground-up UBM pad extending through the first dielectric layer to contact the first contact pad in the conductive layer, the first portion of the ground-up UBM pad having a recessed top surface, and forming a post-passivation interconnect (PPI) on the first dielectric layer, the PPI being a single continuous conductive material in a second region of the interconnect structure, the second region of the interconnect structure determined to be under a second amount of stress, the second amount of stress less than the first amount of stress, the PPI including a PPI pad and a conductive segment, the conductive segment extending through the first dielectric layer to contact the second contact pad in the conductive layer, the PPI pad having a flat top surface. The method further includes depositing a second dielectric layer over the UBM pad and the PPI, forming a plurality of through-vias on the interconnect structure, attaching an integrated circuit die to the interconnect structure, depositing a molding material over the interconnect structure, the plurality of through-vias, and the integrated circuit die, coupling a first connector to the ground-up UBM pad, the first connector contacting sidewalls and the recessed top surface of the ground-up UBM pad, coupling a second connector to the PPI pad, the second connector physically contacting the flat top surface of the PPI pad, and depositing a second dielectric layer on the interconnect structure. A portion of a spherical top surface of the first connector is covered by the second dielectric layer, and at least a portion of the lower half of a spherical top surface of the second connector is covered by the second dielectric layer.

In yet other embodiments, a method of forming a semiconductor device includes determining an amount of reliability risk for a plurality of connector coupling regions, determining a threshold amount of reliability risk, and forming an interconnect. The forming the interconnect includes depositing a conductive layer having a plurality of first contact pads and a plurality of second contact pads, depositing a first dielectric layer on the conductive layer, forming a plurality of ground-up underbump metallization (UBM) pads disposed on the first dielectric layer in respective first regions of the interconnect, the respective first regions of the interconnect determined to be over the threshold amount of reliability risk, a plurality of respective first portions of the plurality of ground-up UBM pads extending through the first dielectric layer to contact respective first contact pads of the plurality of first contact pads in the conductive layer, each of the respective first portions of the plurality of ground-up UBM pads having a respective recessed top surface, and forming a plurality of post-passivation interconnects (PPIs) on the first dielectric layer, each of the plurality of PPIs being a single continuous conductive material in respective second regions of the interconnect, the respective second regions of the interconnect determined to be under the threshold amount of reliability risk, each of the plurality of PPIs including a respective PPI pad and a respective conductive segment, the respective conductive segments extending through the first dielectric layer to contact respective second contact pads of the plurality of second contact pads in the conductive layer, each respective PPI pad having a flat top surface. The method further includes plating a plurality of through-vias on the interconnect, attaching a plurality of dies to the interconnect, depositing a molding material over the interconnect, the plurality of through-vias, and the plurality of dies, depositing a second dielectric layer, on the interconnect, forming a plurality of first openings and a plurality of second openings in the second dielectric layer, such that each of the plurality of first openings exposes respective ground-up UBM pads, and such that each of the plurality of second openings exposes respective PPI pads. The method further includes coupling a plurality of first connectors to respective ground-up UBM pads through respective first openings, each of the plurality of first connectors contacting respective sidewalls and respective recessed top surfaces of the respective ground-up UBM pads, respective portions of respective spherical top surfaces of the plurality of first connectors being covered by the second dielectric layer, and coupling a plurality of second connectors to respective PPI pads, each of the plurality of second connectors physically contacting respective flat top surface of respective PPI pads through respective second openings, respective portions of respective lower halves of respective spherical top surfaces of the plurality of second connectors being covered by the second dielectric layer.

In yet other embodiments, a method of packaging a semiconductor device includes forming an initial interconnect structure design for a semiconductor device package. The initial interconnect structure design includes: a plurality of connector coupling regions, each connector coupling region of the plurality of connector coupling regions including a post-passivation interconnect (PPI) pad; a plurality of first connectors, each first connector of the plurality of first connectors being coupled to a respective PPI pad; and a dielectric layer covering at least a first portion of a lower half of a spherical surface of a first connector of the plurality of first connectors, at least a second portion of the lower half of the spherical surface of the first connector being directly adjacent to an ambient. The method of packaging the semiconductor device further includes: determining a first amount of reliability risk for a first connector coupling region of the plurality of connector coupling regions; determining a threshold amount of reliability risk; altering the initial interconnect structure design by replacing a PPI pad in a first connector coupling region of the plurality of connector coupling regions with a ground-up underball metallization (UBM) pad, the first amount of reliability risk being greater than the threshold amount of reliability risk; and packaging an integrated circuit die with an interconnect structure including the altered interconnect structure design.

In yet other embodiments, a method of packaging a semiconductor device includes forming an initial interconnect structure design for a semiconductor device package. The initial interconnect structure design includes: a first dielectric layer; and a plurality of connector coupling regions, each connector coupling region of the plurality of connector coupling regions including a post-passivation interconnect (PPI) pad directly on the first dielectric layer. The method of packaging the semiconductor device further includes: determining a first amount of reliability risk for a first connector coupling region of the plurality of connector coupling regions; replacing a first PPI pad in a first connector coupling region of the plurality of connector coupling regions of the initial interconnect structure design with a ground-up underball metallization (UBM) pad to form an altered interconnect design, the first amount of reliability risk being greater than a threshold amount of reliability risk, a lower surface of the ground-up UBM pad physically contacting an upper surface of the first dielectric layer, a first portion of the ground-up UBM pad extending through the first dielectric layer, the first portion of the ground-up UBM pad having a recessed top surface; and packaging an integrated circuit die with an interconnect structure including the altered interconnect structure design.

In yet other embodiments, a method of packaging a semiconductor device includes forming an initial interconnect structure design for a semiconductor device package. The initial interconnect structure design includes: a first dielectric layer; and a plurality of connector coupling regions, each connector coupling region of the plurality of connector coupling regions including a respective post-passivation interconnect (PPI) directly on the first dielectric layer, each respective PPI including a respective PPI pad and a respective conductive segment, each respective lower surface of the respective PPI pad physically contacting an upper surface of the first dielectric layer. The method of packaging the semiconductor device further includes: replacing a PPI pad in a first connector coupling region of the plurality of connector coupling regions of the initial interconnect structure design with a ground-up underball metallization (UBM) pad to form an altered interconnect structure design, the first connector coupling region having a first amount of reliability risk greater than a threshold amount of reliability risk; and packaging an integrated circuit die with an interconnect structure including the altered interconnect structure design.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of packaging an integrated circuit die, the method comprising:
   - forming an initial interconnect structure design for a semiconductor device package, the initial interconnect structure design comprising:
     - a plurality of connector coupling regions, each connector coupling region of the plurality of connector coupling regions comprising a post-passivation interconnect (PPI) pad;
     - a plurality of first connectors, each first connector of the plurality of first connectors being coupled to a respective PPI pad; and
     - a dielectric layer covering at least a first portion of a lower half of a spherical surface of a first connector of the plurality of first connectors, at least a second portion of the lower half of the spherical surface of the first connector being directly adjacent to an ambient, wherein the dielectric layer covers a top surface of the respective PPI pad coupled to the first connector;
   - determining a first amount of reliability risk for a first connector coupling region of the plurality of connector coupling regions;
   - determining a threshold amount of reliability risk;
   - altering the initial interconnect structure design by replacing a PPI pad in the first connector coupling region of the plurality of connector coupling regions with a ground-up underball metallization (UBM) pad, the first amount of reliability risk being greater than the threshold amount of reliability risk; and
   - packaging the integrated circuit die with an interconnect structure comprising the altered interconnect structure design.

2. The method of claim 1, wherein packaging the integrated circuit die comprises forming the interconnect structure, coupling the integrated circuit die to the interconnect structure, and forming a molding material around the integrated circuit die.

3. The method of claim 2, wherein packaging the integrated circuit die further comprises coupling a plurality of through-vias to the interconnect structure.

4. The method of claim 3, wherein forming the interconnect structure comprises forming a first interconnect structure, wherein packaging the integrated circuit die further comprises forming a second interconnect structure over the molding material.

5. The method of claim 4, wherein the method comprises forming the first interconnect structure, and after forming the first interconnect structure, forming the second interconnect structure.

6. The method of claim 4, wherein the method comprises forming the second interconnect structure, and after forming the second interconnect structure, forming the first interconnect structure.

7. The method of claim 4, further comprising coupling a packaged semiconductor device to the second interconnect structure.

8. The method of claim 7, further comprising coupling the first interconnect structure to a substrate.

9. A method of packaging an integrated circuit die, the method comprising:
   - forming an initial interconnect structure design for a semiconductor device package, the initial interconnect structure design comprising:
     - a first dielectric layer; and
     - a plurality of connector coupling regions, each connector coupling region of the plurality of connector coupling regions comprising a post-passivation interconnect (PPI) pad directly on the first dielectric layer;
   - determining a first amount of reliability risk for a first connector coupling region of the plurality of connector coupling regions;
   - replacing a first PPI pad in the first connector coupling region of the plurality of connector coupling regions of the initial interconnect structure design with a ground-up underball metallization (UBM) pad to form an altered interconnect design, the first amount of reliability risk being greater than a threshold amount of reliability risk, a lower surface of the ground-up UBM pad physically contacting an upper surface of the first dielectric layer, a first portion of the ground-up UBM pad extending through the first dielectric layer, the first portion of the ground-up UBM pad having a recessed top surface, a second portion of the ground-up UBM pad being over a top surface of the first dielectric layer, a second dielectric layer being on the first dielectric layer, the second dielectric layer covering a sidewall of the second portion of the ground-up UBM pad; and packaging the integrated circuit die with an interconnect structure comprising the altered interconnect structure design.

10. The method of claim 9, wherein the initial interconnect structure design further comprises the second dielectric layer on the first dielectric layer, the second dielectric layer covering a respective top surface and a respective sidewall of each respective PPI pad.

11. The method of claim 9 wherein the altered interconnect structure design further comprises coupling a first connector to a second PPI pad in a second connector coupling region of the plurality of connector coupling regions, wherein the second dielectric layer covers a lower portion of the first connector.

12. The method of claim 11, wherein an upper portion of the first connector is above an uppermost surface of the second dielectric layer.

13. The method of claim 9 wherein the altered interconnect structure design further comprises coupling a second connector to the ground-up UBM pad, wherein the second dielectric layer covers a lower portion of the second connector.

14. The method of claim 13, wherein a sidewall of the second connector above the second dielectric layer is above an uppermost surface of the second dielectric layer.

15. A method of packaging an integrated circuit die, the method comprising:

forming an initial interconnect structure design for a semiconductor device package, the initial interconnect structure design comprising:

a first dielectric layer; and a plurality of connector coupling regions, each connector coupling region of the plurality of connector coupling regions comprising a respective post-passivation interconnect (PPI) directly on the first dielectric layer, each respective PPI comprising a respective PPI pad and a respective conductive segment, each respective lower surface of the respective PPI pad physically contacting an upper surface of the first dielectric layer;

replacing a PPI pad in a first connector coupling region of the plurality of connector coupling regions of the initial interconnect structure design with a ground-up underball metallization (UBM) pad to form an altered interconnect structure design, the first connector coupling region having a first amount of reliability risk greater than a threshold amount of reliability risk, wherein a second dielectric layer covers a top surface and a sidewall of the ground-up UBM pad, the second dielectric layer being on the first dielectric layer; and packaging the integrated circuit die with an interconnect structure comprising the altered interconnect structure design.

16. The method of claim 15, wherein the altered interconnect structure design further comprises a second connector coupling region, the second connector coupling region comprising a first PPI pad.

17. The method of claim 16, wherein the second connector coupling region has a first distance to a neutral position (DNP) and wherein the first connector coupling region of the altered interconnect structure design has a second DNP, the second DNP being greater than the first DNP.

18. The method of claim 17, wherein the altered interconnect structure design further comprises an array of connectors, wherein a first connector of the array of connectors is coupled to the ground-up UBM pad.

19. The method of claim 18, wherein the neutral position comprises a center of the array of connectors.

20. The method of claim 18, wherein the first connector coupling region is located in a corner of the array of connectors.

* * * * *